United States Patent [19]
Bien et al.

[11] Patent Number: 5,650,743
[45] Date of Patent: Jul. 22, 1997

[54] COMMON MODE CONTROLLED SIGNAL MULTIPLIER

[75] Inventors: David Edward Bien, Tucson, Ariz.; Mark Douglas McDonald, Campbell, Calif.

[73] Assignee: National Semiconductor Corporation, Santa Clara, Calif.

[21] Appl. No.: 570,911

[22] Filed: Dec. 12, 1995

[51] Int. Cl.$^6$ .................. G06F 7/44; G06G 7/16
[52] U.S. Cl. .................. 327/359; 327/42; 327/361; 455/326
[58] Field of Search .................. 327/40, 42, 65, 327/52, 90, 355, 357, 359, 361, 215, 219; 455/209, 326; 330/252, 253, 277

[56] References Cited

U.S. PATENT DOCUMENTS

| | | | |
|---|---|---|---|
| 3,689,752 | 9/1972 | Gilbert | 235/194 |
| 3,931,583 | 1/1976 | Gilbert | 330/38 |
| 4,075,574 | 2/1978 | Gilbert | 330/257 |
| 4,090,145 | 5/1978 | Webb | 327/355 |

(List continued on next page.)

FOREIGN PATENT DOCUMENTS

| | | |
|---|---|---|
| 0 416 889 | 3/1991 | European Pat. Off. . |
| 358201176 | 11/1983 | Japan .................. 327/361 |
| 63-56767 | 3/1988 | Japan . |

| | | |
|---|---|---|
| 1443125 | 12/1988 | U.S.S.R. .................. 327/40 |

OTHER PUBLICATIONS

D.C. Surana and J.G. Gardiner, "Crosscoupled Transistor Mixer", Proceedings of the IEEE, vol. 117, No. 11, Nov. 1970, pp. 2105–2108.

Paul R. Gray and Robert G. Meyer, "Analysis and Design of Analog Integrated Circuits", Second Edition, pp. 194–197, 590–599, 705 and 706 No Month.

(List continued on next page.)

Primary Examiner—Timothy P. Callahan
Assistant Examiner—My-Trang Nu Ton
Attorney, Agent, or Firm—Limbach & Limbach L.L.P.

[57] ABSTRACT

A common mode controlled signal multiplier includes a pair of interconnected differential amplifiers, each of which receives a common mode signal and an input signal and generates one phase of a differential output signal. In one of the differential amplifiers, the common mode signal is applied to the input terminal of each transistor, while the input signal is applied differentially to the input terminals of the transistors. In the other differential amplifier, an inverse phase of the common mode signal is applied to the input terminal of each transistor, while the input signal is applied differentially to the input terminals of the transistors. The differential amplifiers together generate the differential output signal, with such differential output signal having output frequencies including a sum of and a difference between the frequencies of the common mode signal and the input signal.

20 Claims, 12 Drawing Sheets

U.S. PATENT DOCUMENTS

| | | | |
|---|---|---|---|
| 4,156,283 | 5/1979 | Gilbert | 364/841 |
| 4,268,759 | 5/1981 | Gilbert | 307/490 |
| 4,357,549 | 11/1982 | Miller | 327/40 |
| 4,604,532 | 8/1986 | Gilbert | 307/490 |
| 4,658,440 | 4/1987 | Pavio et al. | 455/324 |
| 4,704,738 | 11/1987 | Graziadei et al. | 455/253 |
| 4,910,801 | 3/1990 | Anzini et al. | 455/326 |
| 5,083,050 | 1/1992 | Vasile | 307/529 |
| 5,438,296 | 8/1995 | Kimura | 327/359 |
| 5,469,087 | 11/1995 | Eatwell | 327/40 |
| 5,523,717 | 6/1996 | Kimura | 327/359 |
| 5,525,928 | 6/1996 | Asakawa | 327/361 |
| 5,576,653 | 11/1996 | Kimura | 327/359 |
| 5,581,210 | 12/1996 | Kimura | 327/359 |

OTHER PUBLICATIONS

Barrie Gilbert, "A New Wide–Band Amplifier Technique", IEEE Journal of Solid–State Circuits, vol. SC–3, No. 4, Dec. 1968, pp. 353–365.

Barrie Gilbert, "A High–Performance Monolithic Multiplier Using Active Feedback", IEEE Journal of Solid–State Circuits, vol. SC–9, No. 6, Dec. 1974, pp. 364–373.

Barrie Gilbert, "A New Technique for Analog Multiplication", IEEE Journal of Solid–State Circuits, vol. SC–10, No. 6, Dec. 1975, pp. 437–447.

Klaas Bult and Hans Wallinga, "A CMOS Four–Quadrant Analog Multiplier", IEEE Journal of Solid–State Circuits, vol. SC–21, No. 3, Jun. 1986, pp. 430–435.

Zhenhua Wang, "A CMOS Four–Quadrant Analog Multiplier with Single–Ended Voltage Output and Improved Temperature Performance", IEEE Journal of Solid–State Circuits, vol. 26, No. 9, Sep. 1991, pp. 1293–1301.

Barrie Gilbert, "Single–Ended–Input Single–Ended–Output Four–Quadrant Analog Multiplier", IEEE Journal of Solid–State Circuits, Oct. 1972, vol. SC–7, No. 5, p. 434.

COMMON MODE CONTROLLED SIGNAL MULTIPLIER

BACKGROUND OF THE INVENTION

1. Field of the Invention

The present invention relates to mixer, or signal multiplier, circuits, and in particular, to such circuits which employ differential amplifiers.

2. Description of the Related Art

Signal multiplier circuits, commonly referred to as mixers, are well known in the art and are used in many applications. One form of mixer, in particular, which is often used relies upon and takes advantage of the logarithmic voltage versus current characteristics of a differential amplifier circuit which causes the output signal to be a linear and amplified function of the input signals. By taking advantage of such characteristics, a linear multiplier circuit can be realized. A number of examples of such circuits can be found in U.S. Pat. No. 3,689,752, the disclosure of which is incorporated herein by reference as background information about the related art.

However, such mixer circuits in their conventional form have a number of disadvantages. One disadvantage is that, due to the necessary stacking, or totem-pole coupling, of the transistors, the available voltage range of the output signal is limited. Accordingly, to achieve higher voltage ranges, a higher power supply voltage becomes required. A second disadvantage is that many such circuits require a relatively large number of transistors, thereby increasing the sources of and potential for the introduction of noise into the output signal. Therefore, it would be desirable to have an improved signal multiplier circuit which addresses such disadvantages of conventional multiplier circuits.

SUMMARY OF THE INVENTION

A common mode controlled signal multiplier in accordance with the present invention advantageously uses common mode techniques in conjunction with differential techniques for mixing, i.e. multiplying, ac signals. In so doing, one benefit which is realized is that of increased output signal voltage or, alternatively, reduced power supply voltage requirements. Additionally, for a given level of performance, fewer transistors are required.

A common mode controlled signal multiplier in accordance with one embodiment of the present invention includes mutually coupled first and second differential amplifiers. The first differential amplifier is for receiving a first common mode signal with a first frequency and a first input signal with a second frequency. The second differential amplifier is for receiving a second common mode signal with the first frequency and a second input signal with the second frequency. In accordance with the common mode signals and the input signals, the differential amplifiers together provide an output signal with third and fourth frequencies which equal a sum of the first and second frequencies and a difference between the first and second frequencies, respectively.

These and other features and advantages of the present invention will be understood upon consideration of the following detailed description of the invention and the accompanying drawings.

DETAILED DESCRIPTION OF THE INVENTION

Figure 1:
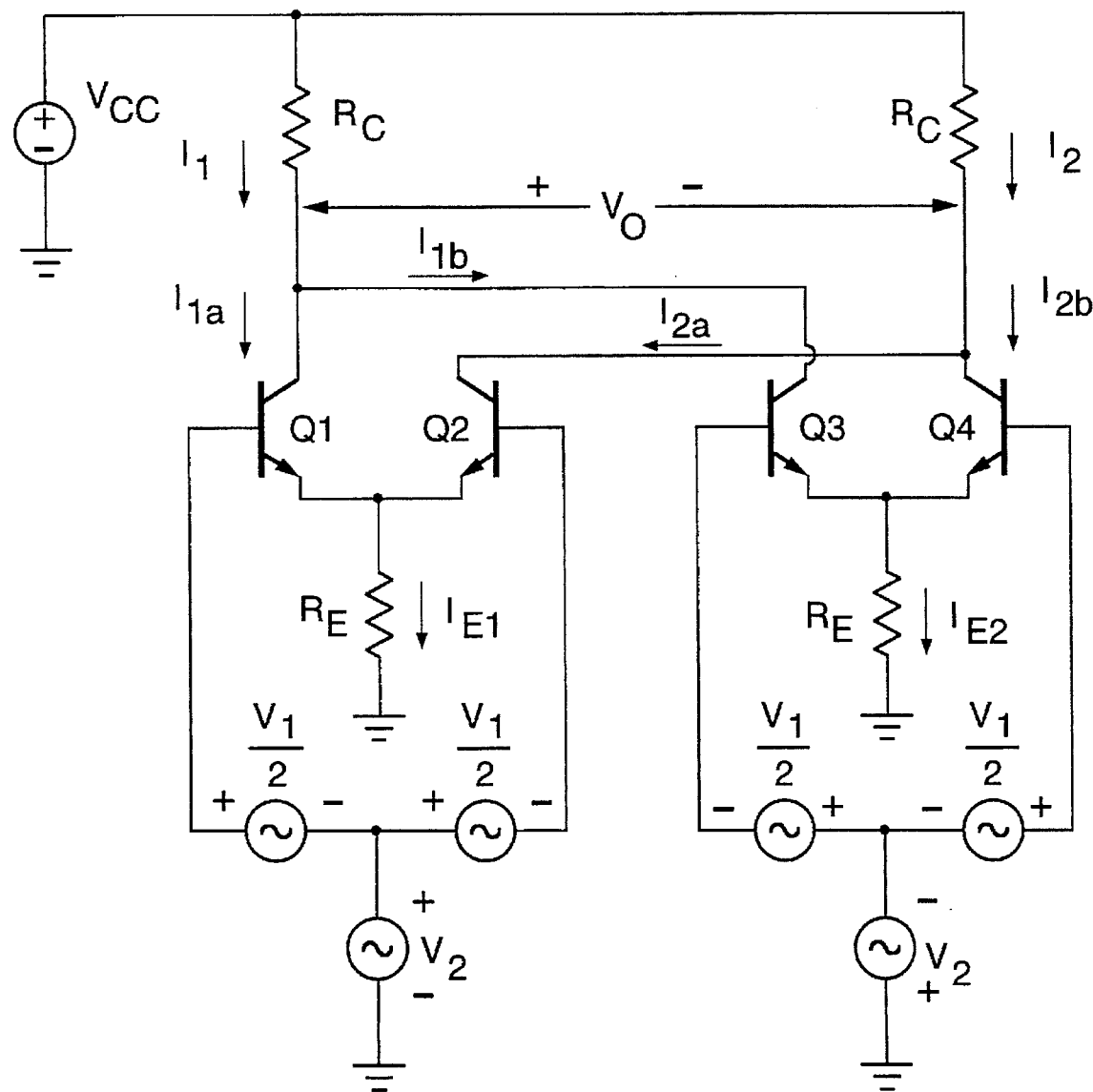
FIG. 1 is a schematic circuit diagram of a common mode controlled signal multiplier in accordance with one embodiment of the present invention.

Referring to FIG. 1, a common mode controlled signal multiplier circuit in accordance with one embodiment of the present invention includes two cross-connected differential amplifiers, each of which is driven by a common mode input signal of opposite phases and a differential input signal. In the first differential amplifier, the bases of transistors Q1 and Q2 are both driven by a common mode input signal $V_2$, while together the bases of transistors Q1 and Q2 are driven by a differential input signal $V_1$ (by driving the base of transistor Q1 with a single-ended input signal $V_1/2$ and driving the base of transistor Q2 with the opposite phase of single-ended input signal $V_1/2$). Similarly, in the other differential amplifier, the bases of transistors Q3 and Q4 are both driven by a common mode input signal $-V_2$ opposite in phase to that of the common mode input signal $V_2$ to transistors Q1 and Q2. Further similarly, the bases of transistors Q3 and Q4 together are driven by a differential input signal $V_1$. Currents $I_1$ and $I_2$ from the power supply VCC flow through the collector biasing resistors $R_c$. These currents $I_1$, $I_2$ divide into current $I_{1a}$ into the collector of transistor Q1, current $I_{1b}$ into the collector of transistor Q3, current $I_{2a}$ into the collector of transistor Q2 and current $I_{2b}$ into the collector of transistor Q4. The emitter currents of transistors Q1 and Q2 combine to form current $I_{E1}$ and the emitter currents of transistors Q3 and Q4 combined to form current $I_{E2}$ through their respective emitter resistors $R_E$.

As should be understood from FIG. 1, the first combined emitter current $I_{E1}$ is a function of its common mode input signal $V_2$. Similarly, the second combined emitter current $I_{E2}$ is a function of its common mode input signal $-V_2$. This can be represented as follows in Equations (1a) and (1b):

$$I_{E1} = f(V_2) \quad (1a)$$

$$I_{E2} = f(-V_2) = -f(V_2) \quad (1b)$$

Accordingly, the various collector currents $I_{1a}$, $I_{1b}$, $I_{2a}$ and $I_{2b}$ of transistors Q1, Q2, Q3 and Q4, respectively, are also functions of the common mode input signals $V_2$, $-V_2$, in accordance with the operating characteristics of the transistors Q1, Q2, Q3, Q4. In this particular embodiment, such operating characteristics are those for NPN bipolar junction transistors, which are well known in the art. These functions representing the collector currents $I_{1a}$, $I_{1b}$, $I_{2a}$ and $I_{2b}$ can be represented as follows in Equations (2a)–(2d):

$$I_{1a} = f(V_2)/(1+e^{-Vd/Vt}) \quad (2a)$$

$$I_{1b} = -f(V_2)/(1+e^{Vd/Vt}) \quad (2b)$$

$$I_{2a} = f(V_2)/(1+e^{-Vd/Vt}) \quad (2c)$$

$$I_{2b} = -f(V_2)/(1+e^{Vd/Vt}) \quad (2d)$$

where:

$Vd = V_1/2 - (-V_1/2) = V_1$ $Vt$ = volt-equivalent of temperature = $KT/Q$ $K$ = Boltzmann constant $\approx 1.38 \times 10^{-23}$ Joules/[(molecule)(° K.)]

$T$ = temperature in degrees Kelvin (° K.)

$Q$ = electronic charge $\approx 1.6 \times 10^{-19}$ Coulombs.

Using the foregoing expressions for the collector currents $I_{1a}$, $I_{1b}$, $I_{2a}$, $I_{2b}$, the power supply currents $I_1$ and $I_2$ can be expressed as follows in Equations (3a) and (3b):

$$\begin{aligned} I_1 &= I_{1a} + I_{1b} & (3a) \\ &= f(V_2)/(1+e^{-Vd/Vt}) + -f(V_2)/(1+e^{Vd/Vt}) \\ &= f(V_2)\tanh[Vd/(2Vt)] \\ I_2 &= I_{2a} + I_{2b} & (3b) \\ &= f(V_2)/(1+e^{Vd/Vt}) + -f(V_2)/(1+e^{-Vd/Vt}) \\ &= f(V_2)\tanh[Vd/(2Vt)] \end{aligned}$$

Based upon the foregoing, a differential output voltage $V_O$, taken between the collectors of transistors Q1 and Q4 as shown, represents the product of the two input signals $V_1$ and $V_2$ and can be represented as follows in Equation (4):

$$\begin{aligned} V_O &= R_C(I_2 - I_1) & (4) \\ &= -2R_C f(V_2)\tanh[Vd/(2Vt)] \end{aligned}$$

where: $f(V_2) = (V_2 - V_{BE})/R_E \approx V_2/R_E$.

The signals required to control the tail currents of the mixing differential pairs, i.e. the common mode input signals $V_2$, $-V_2$, can be introduced in accordance with a variety of techniques. For example, operational amplifiers can be used to generate the appropriate common mode signals $V_2$, $-V_2$ to a high degree of precision. This technique would be particularly suitable for modulator circuits where the low frequency signals cannot be significantly distorted but the bandwidths of such signals is quite limited.

Figure 2:
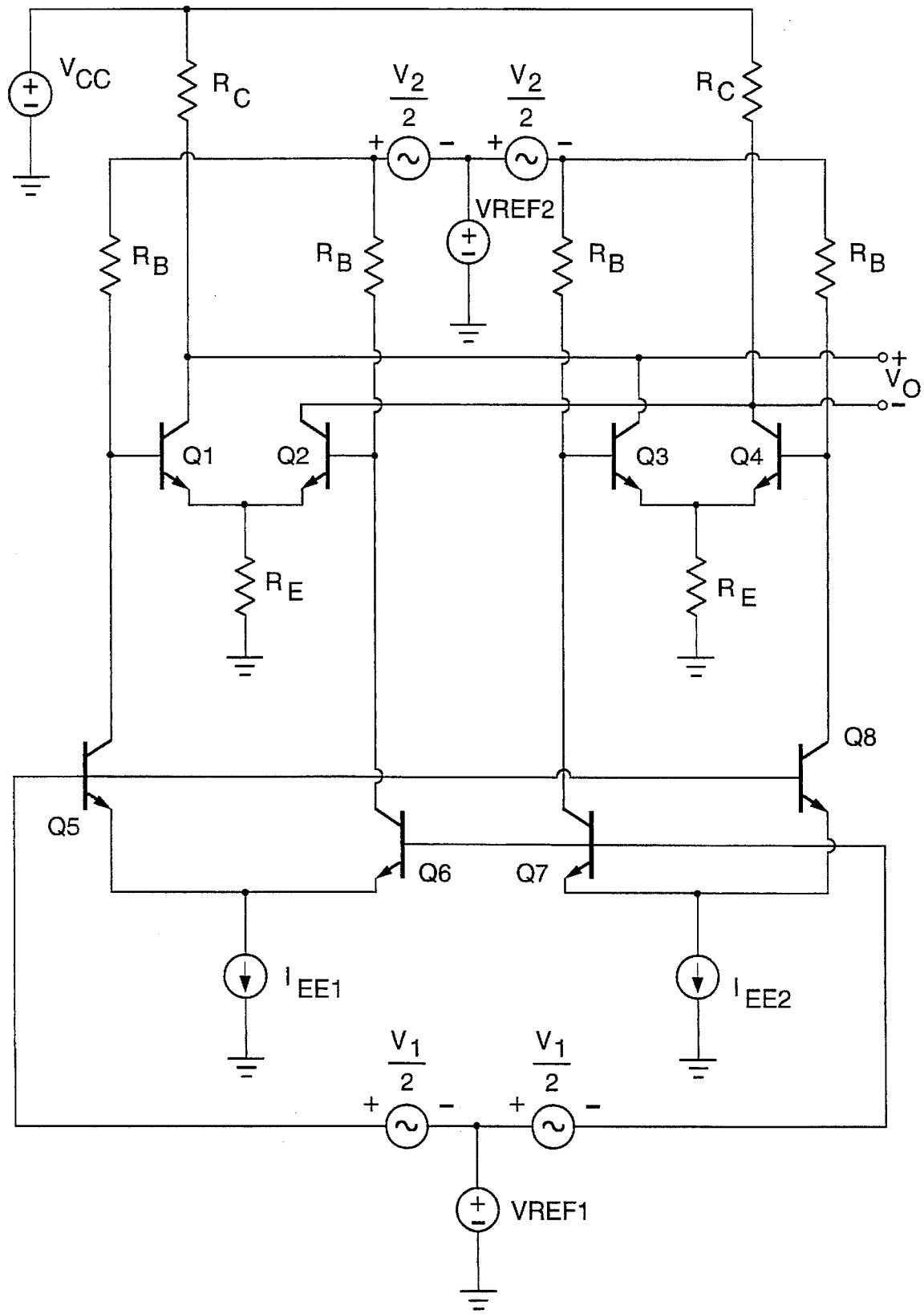
FIG. 2 is a schematic circuit diagram of a common mode controlled signal multiplier in accordance with another embodiment of the present invention.

Referring to FIG. 2, a common mode controlled signal multiplier in accordance with another embodiment of the present invention includes two differential amplifiers, similar to those discussed above for the circuit of FIG. 1, plus a pair of auxiliary differential amplifiers for providing the differential input signal. In the first differential amplifier, the bases of transistors Q1 and Q2 are driven by a common mode input signal $V_2/2$, as well as a DC biasing voltage VREF2. In the second differential amplifier, the bases of transistors Q3 and Q4 are driven by the inverse phase $-V_2/2$ of the common mode input signal, as well as the DC biasing voltage VREF2. In the first auxiliary differential amplifier, the bases of transistors Q5 and Q6 are driven together by a differential input signal $V_1$, as well as a DC biasing voltage VREF1. Similarly, in the second auxiliary differential amplifier, the bases of transistors Q7 and Q8 are driven by the inverse phase $-V_1$ of the differential input signal, as well as the DC biasing voltage VREF1. The emitters of transistors Q5 and Q6 are further driven by a current source $I_{EE1}$, while the emitters of transistors Q7 and Q8 are driven by another current source $I_{EE2}$. The differential signal applied to the bases of transistors Q5 and Q6 and the bases of transistors Q7 and Q8 result in corresponding differential input signals to be generated and provided at the bases of transistors Q1 and Q2 and the bases of transistors Q3 and Q4, respectively. A differential output signal $V_O$ is provided between the collectors of transistors Q1 and Q4.

Figure 3:
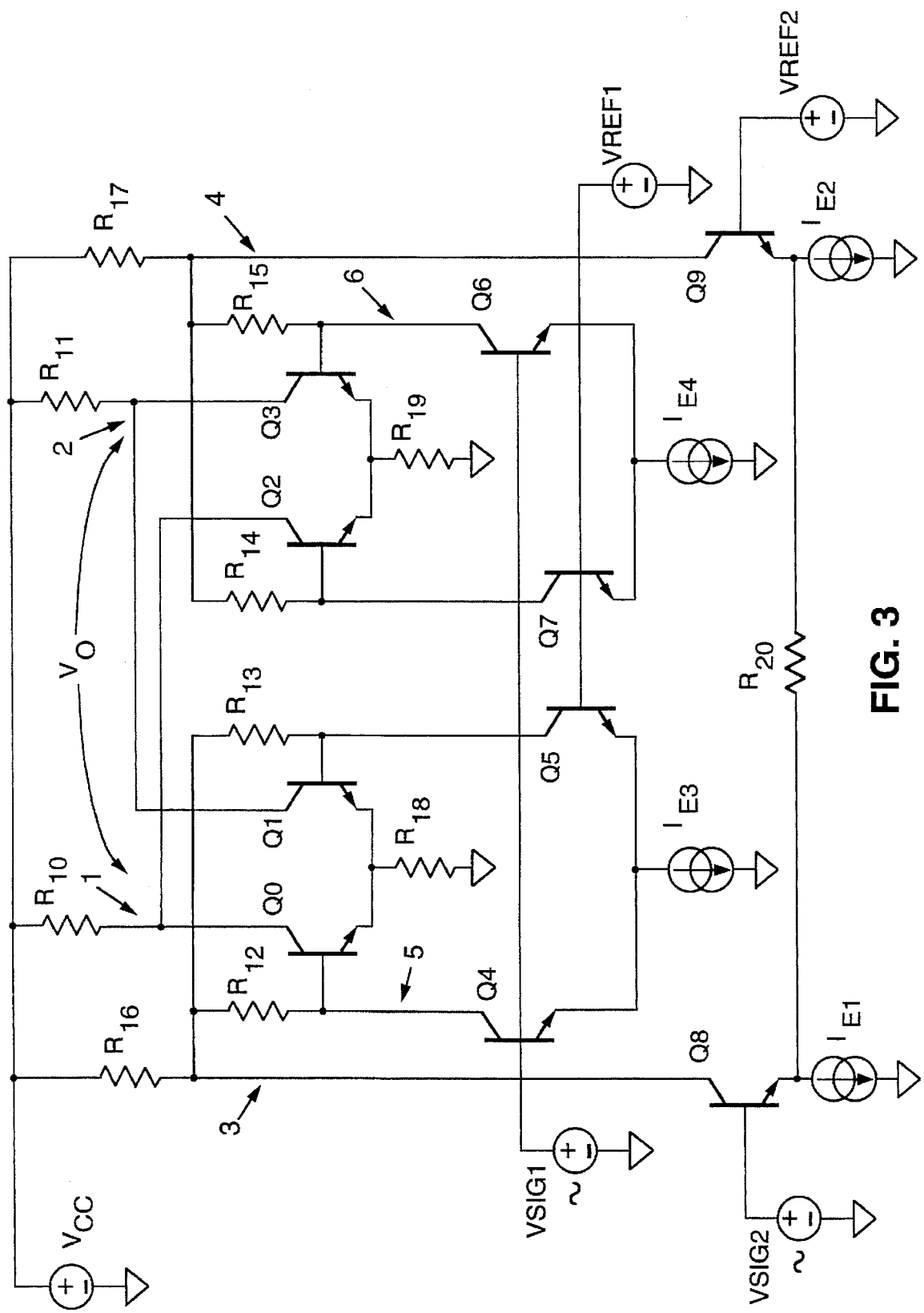
FIG. 3 is a schematic circuit diagram of a common mode controlled signal multiplier in accordance with a further embodiment of the present invention.

Referring to FIG. 3, a common mode controlled signal multiplier having a circuit topography similar to that of the circuit of FIG. 2 was constructed using simulation techniques. The differential input signals driving the auxiliary differential amplifiers were replaced with a single ended input signal VSIG1 and a DC reference voltage VREF1. The common mode input signals ($V_2/2$ and $-V_2/2$ in FIG. 2) were introduced to the primary differential amplifiers, i.e. to the bases of transistors Q0 and Q1 and transistors Q2 and Q3, by way of a differential buffer amplifier consisting of transistors Q8 and Q9 biased by emitter current sources $I_{E1}$ and $I_{E2}$ and coupled at their emitters by resistor R20. With the base of transistor Q9 biased by a DC reference voltage VREF2, the input signal VSIG2 at the base of transistor Q8 causes a differential signal to appear between the collectors of transistors Q8 and Q9. The opposing phases of this differential signal serve as the equal but oppositely-phased common mode input signals to the primary differential amplifiers (transistor pairs Q0/Q1 and Q2/Q3). A differential output signal is provided between the collectors of transistors Q0 and Q3.

Figure 3A:
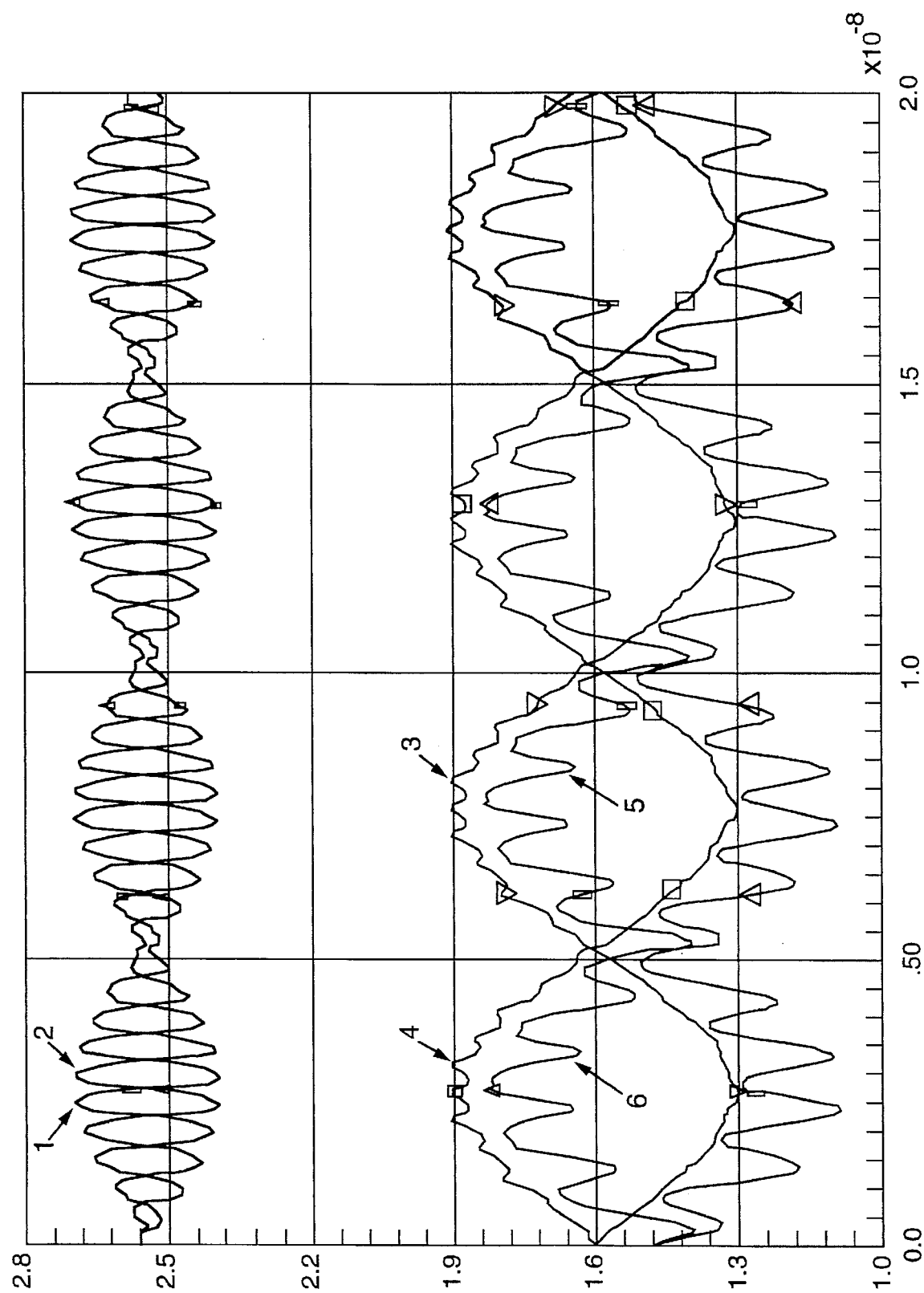
FIG. 3A is a signal timing diagram for the signals identified in FIG. 3.

Referring to FIG. 3A, the relative amplitude and timing relationships of the numbered signals identified in FIG. 3 are illustrated. Signals numbered 1 and 2 are the opposing phases of the differential output signal $V_O$. Signals numbered 3 and 4 are the oppositely-phased common mode input signals to the primary differential amplifiers. Signals numbered 5 and 6 are the corresponding, but oppositely-phased, phases of the differential input signals to the primary differential amplifiers.

Figure 4:
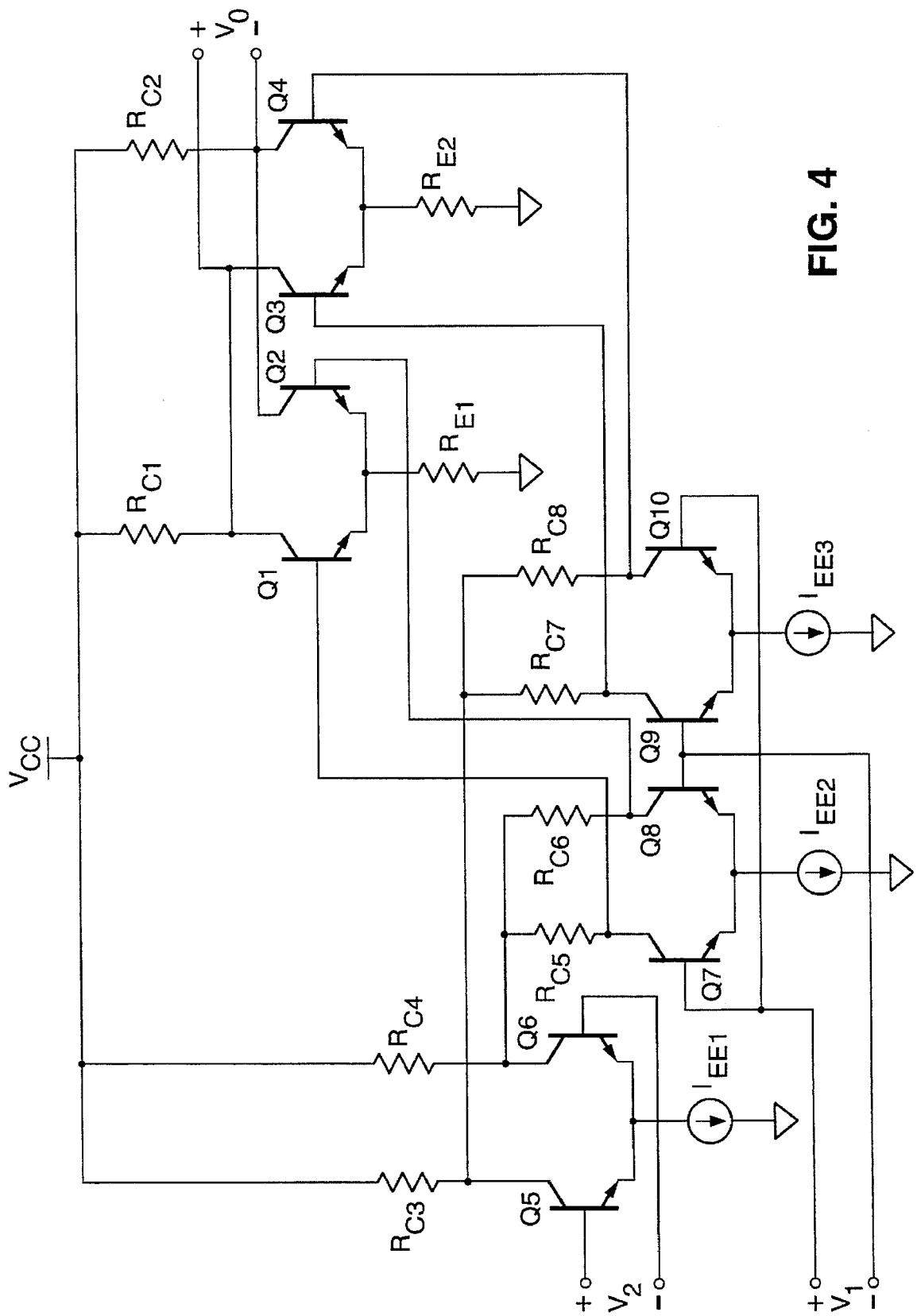
FIG. 4 is a schematic circuit diagram of a common mode controlled signal multiplier in accordance with still another embodiment of the present invention.

Referring to FIG. 4, another embodiment of a common mode controlled signal multiplier circuit in accordance with the present invention includes 5 differential amplifiers. In the first primary differential amplifier, the bases of transistors Q1 and Q2 are driven by combined common mode and differential input signals generated at the collectors of transistors Q7 and Q8. In the second primary differential amplifier, the bases of transistors Q3 and Q4 are driven by combined common mode and differential input signals generated at the collectors of transistors Q9 and Q10. The first input signal $V_1$ is a differential signal which drives the differential amplifiers having transistors Q7 and Q8 and transistors Q9 and Q10. This results in oppositely-phased differential signals being generated at the collectors of transistors Q7 and Q8 and at the collectors of transistors Q9 and Q10. The second input signal $V_2$ is a differential input signal which drives the bases of Q5 and Q6. The opposing phases of the resulting differential output signal from this differential amplifier are used as oppositely phased common mode input signals to the collector circuits of transistors Q7, Q8, Q9 and Q10. Due to signal summing action, this results in the aforementioned combined common mode and differential signals at the collectors of transistors Q7, Q8, Q9 and Q10. A differential output signal $V_O$ is provided between the collectors of transistors Q1 and Q4 of the primary differential amplifiers.

Figure 5:
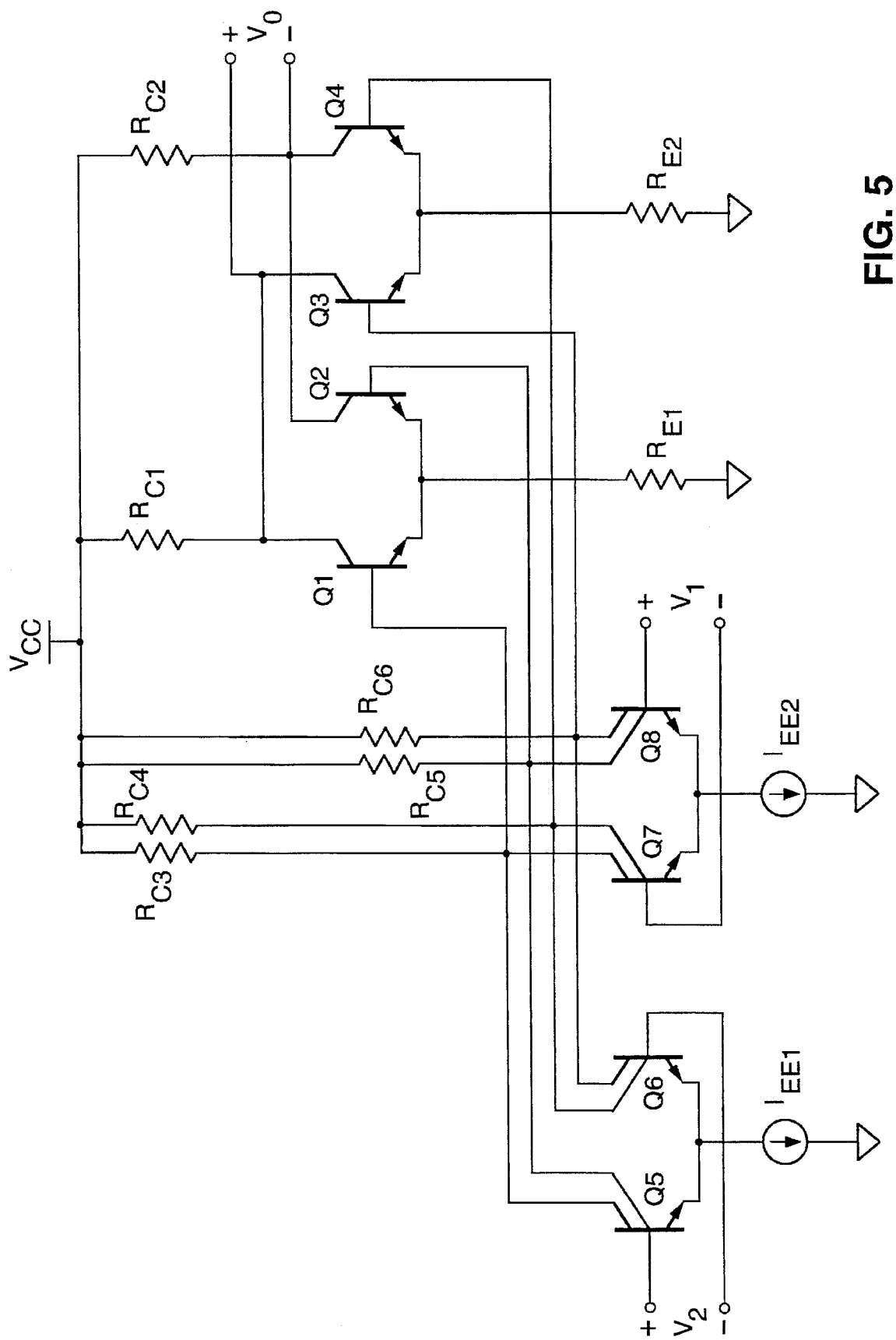
FIG. 5 is a schematic circuit diagram of a common mode controlled signal multiplier in accordance with yet another embodiment of the present invention.

Referring to FIG. 5, yet another embodiment of a common mode controlled signal multiplier circuit in accordance with the present invention includes four differential amplifiers. Similar to the circuit of FIG. 4, the primary differential amplifiers formed by transistors Q1 and Q2 and transistors Q3 and Q4 have their inputs driven by combined common mode and differential input signals. The first input differential amplifier, having multiple-collector transistors Q7 and Q8, is driven by a differential input signal $V_1$. The resulting differential output signals between the collectors of Q7 and the collectors of Q8 provide the differential signal component of the input signals to the primary differential amplifiers. The second input differential amplifier, having multiple-collector transistors Q5 and Q6, is driven by a differential input signal $V_2$. The resulting opposing phases of the differential signals between the collector of Q5 and the collectors of Q6 provide the common mode signal components of the inputs to the primary differential amplifiers. A differential output signal $V_O$ is provided between the collectors of transistors Q1 and Q4 of the primary differential amplifiers.

Figure 6:
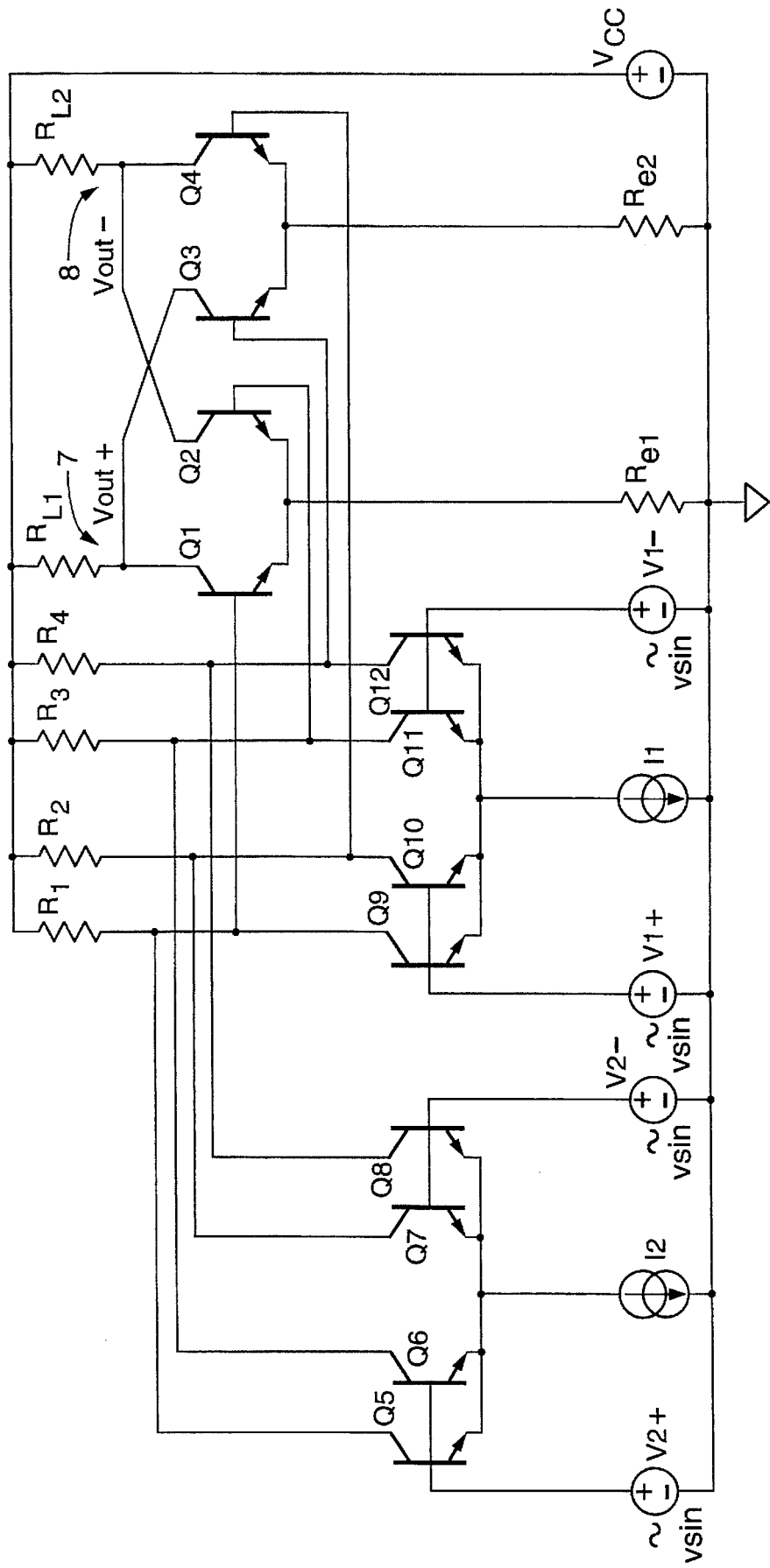
FIG. 6 is a schematic circuit diagram of a common mode controlled signal multiplier in accordance with a still further embodiment of the present invention.

Referring to FIG. 6, a common mode controlled signal multiplier circuit similar to that shown in FIG. 5 was tested using simulation techniques. The circuit of FIG. 6 is substantially similar in topography to that of FIG. 5, with the exception that single-collector transistors Q5, Q6, Q7, Q8, Q9, Q10, Q11, Q12 are substituted for the multiple-collector transistors Q5, Q6, Q7, Q8 of the circuit of FIG. 5. Accordingly, the common mode input signal to the bases of transistors Q1 and Q2 is provided by transistors Q5 and Q6 in accordance with one phase V2+ of input signal $V_2$, while the common mode input signal to the bases of transistors Q3 and Q4 is provided by transistors Q7 and Q8 in accordance with the opposing phase V2− of input signal $V_2$. Further accordingly, the differential input signal to the bases of transistors Q1 and Q2 is provided by transistors Q9 and Q11 and the differential input signal to the bases of transistors Q3 and Q4 is provided by transistors Q10 and Q12 in accordance with the opposing phases V1+, V1− of input signal $V_1$.

Figure 6A:
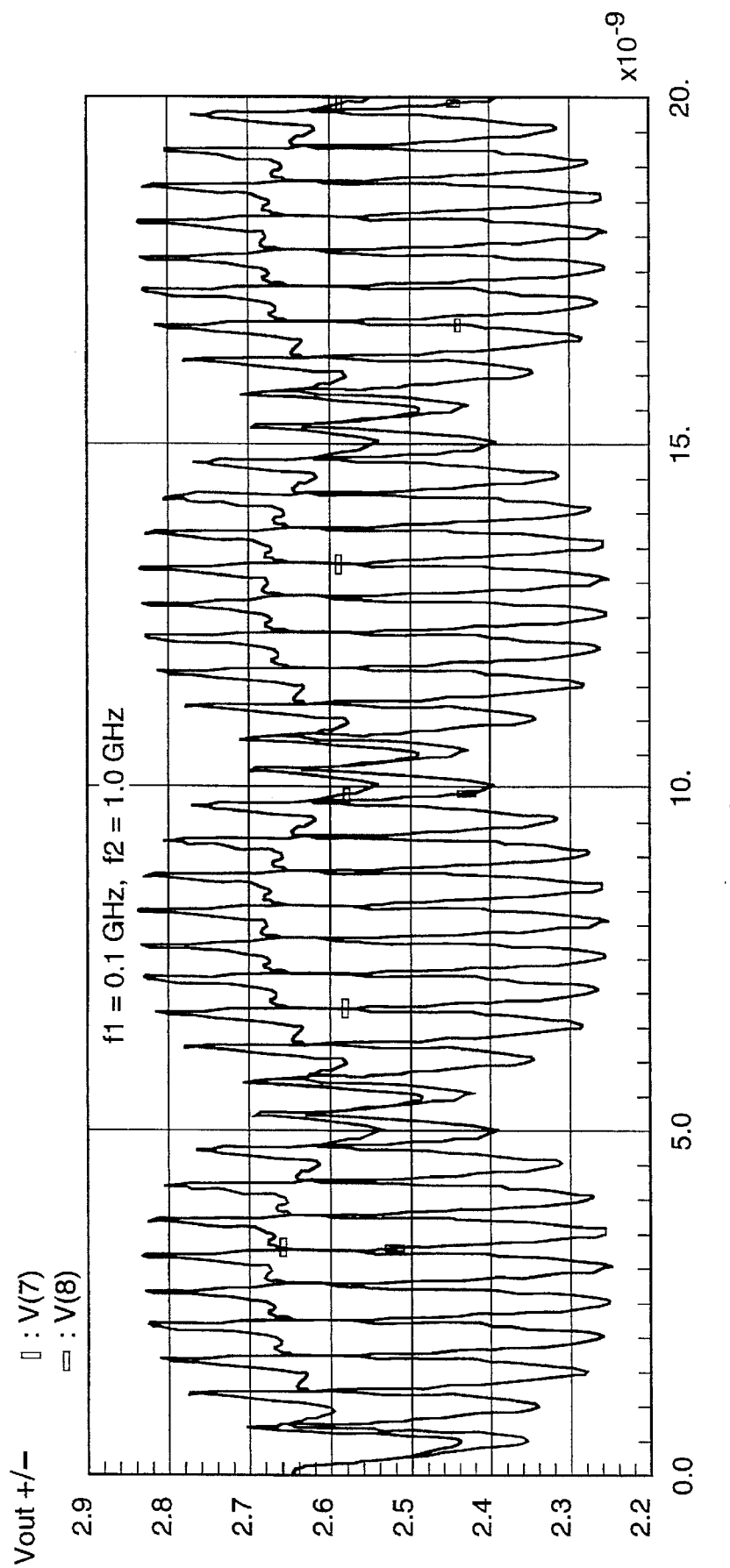
FIG. 6A is a signal timing diagram for the signals identified in FIG. 6.

Referring to FIG. 6A, the relative amplitude and timing relationships of the opposing phases of the output signal $V_O$ are illustrated.

Figure 6B:
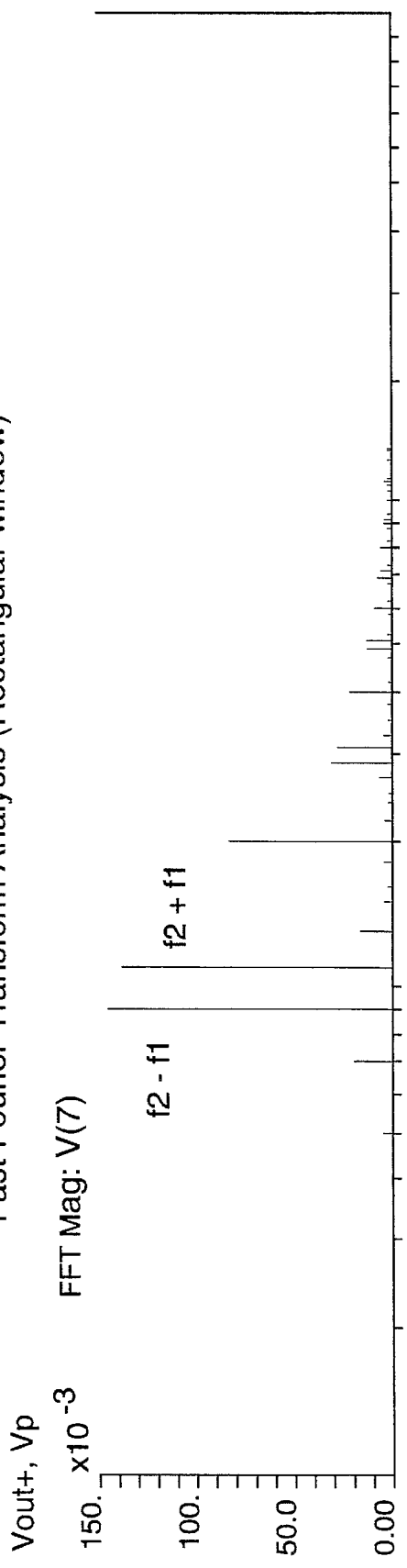
FIG. 6B illustrates a Fast Fourier Transform analysis of the signals of FIG. 6A.
Figure 6B:
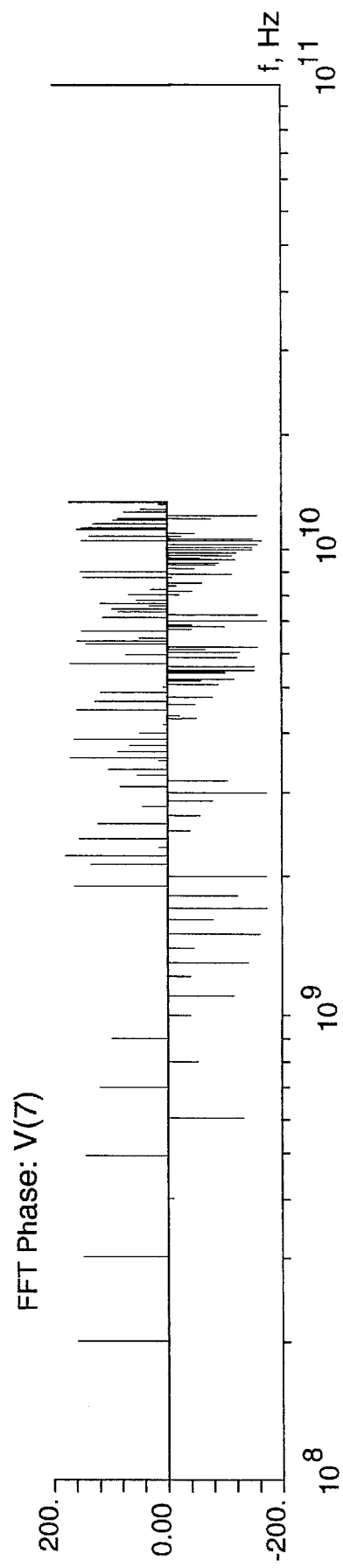

Referring FIG. 6B, a Fast Fourier Transform analysis (using a rectangular window) is illustrated for one of the phases of the output signal $V_O$. As expected, the output signal $V_O$ is the product of the two input signals $V_1$ and $V_2$ having frequencies f1 and f2, respectively. Therefore, the output signal $V_O$ contains, primarily, frequency components equalling the sum (f2+f1) of and difference (f2−f1) between the input frequencies f1, f2 of the input signals $V_1$, $V_2$.

In accordance with the foregoing discussion, it should be understood that even though the exemplary embodiments of a common mode controlled signal multiplier circuit in accordance with the present invention have been disclosed with the use of NPN bipolar transistors, other types of transistors can be substituted, with appropriate modifications to circuit topography, for practicing the present invention. For example, the above-discussed NPN bipolar transistors can be replaced by PNP bipolar transistors with appropriate reversals of power supply voltage and current supply polarities. In accordance with the foregoing discussion, it should be understood that the use of bipolar junction transistors in the circuit topography(ies) as disclosed herein advantageously provides a significantly more linear multiplier circuit. For example, referring back to Equation (4) hereinabove, it can be readily seen that the output voltage $V_O$ is a substantially linear function of the various circuit parameters and input signals. For example: the first factor "$-2R_C$" is a linear constant dependent upon the value of the collector resistor $R_C$; the second factor "$f(V_2)$" is approximately linear $[=(V_2-V_{BE})/R_E \approx V_2/R_E]$, with the degree of linearity being dependent upon how much larger the common mode voltage $V_2$ is as compared to the base-emitter voltage $V_{BE}$; and the third factor "tanh[Vd/(2Vt)]" is linear under small signal conditions, i.e. for small differential input signal $V_d$ levels (and where the volt-equivalent of temperature $V_t$ is a constant).

Figure 7:
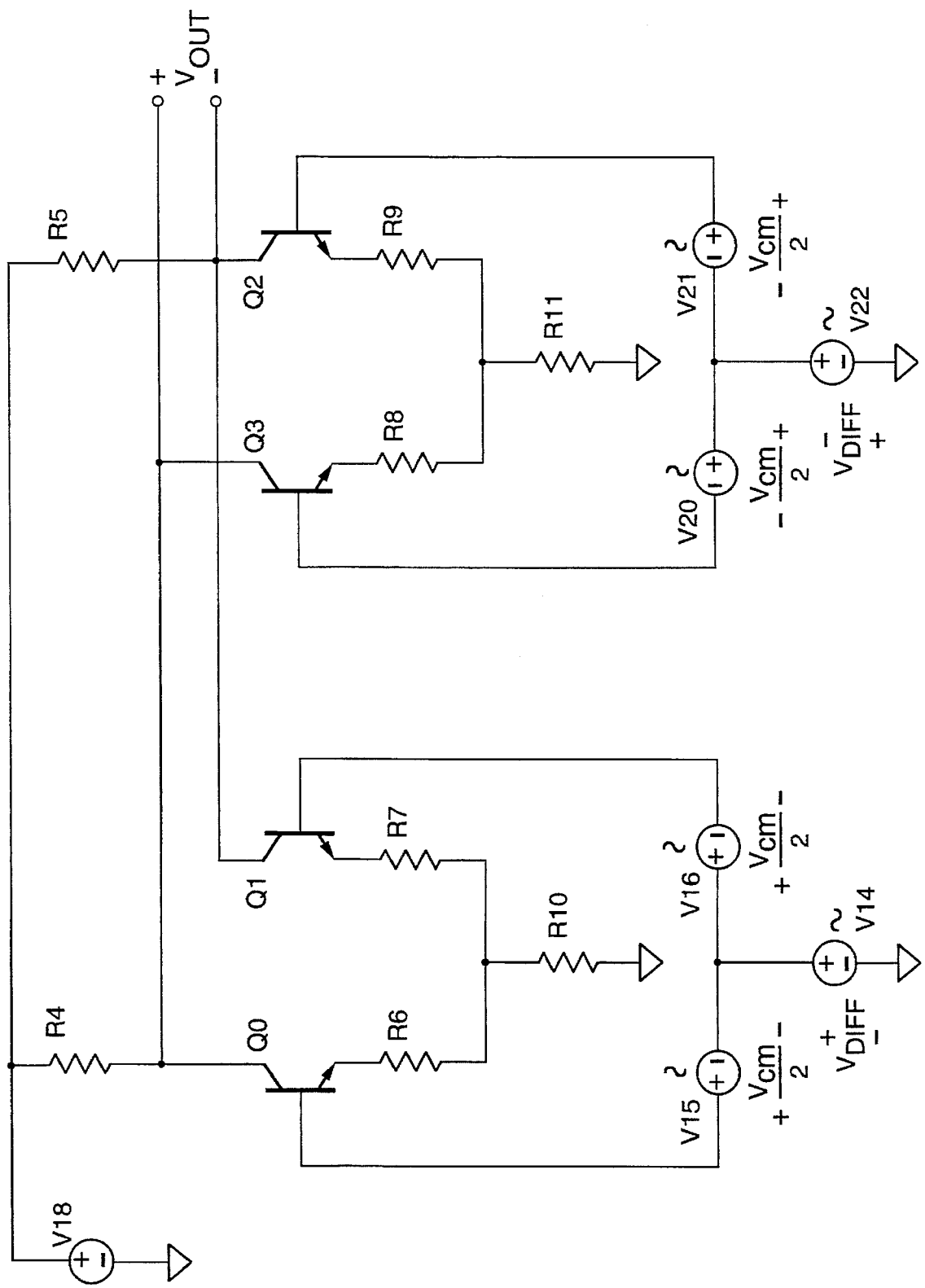
FIG. 7 is a schematic circuit diagram of a common mode controlled signal multiplier in accordance with still another embodiment of the present invention.

Referring to FIG. 7, linearity of the output voltage $V_{OUT}$ can be further improved upon by adding degenerative resistors R6, R7, R8 and R9 in the emitter circuits of multiplying transistors Q0, Q1, Q3 and Q2, respectively. Such resistances would typically be selected to be significantly larger than the internal nonlinear emitter diode resistances ($r_e'$) of the individual transistors Q0, Q1, Q2, Q3. Also, due to the voltages generated across them by the emitter currents they conduct, such resistances provide some negative feedback with respect to the base-emitter voltages ($V_{be}$) of the transistors Q0, Q1, Q2, Q3, thereby significantly swamping out nonlinearities in gain caused by the emitter diode resistances of the transistors Q0, Q1, Q2, Q3.

Figure 7A:
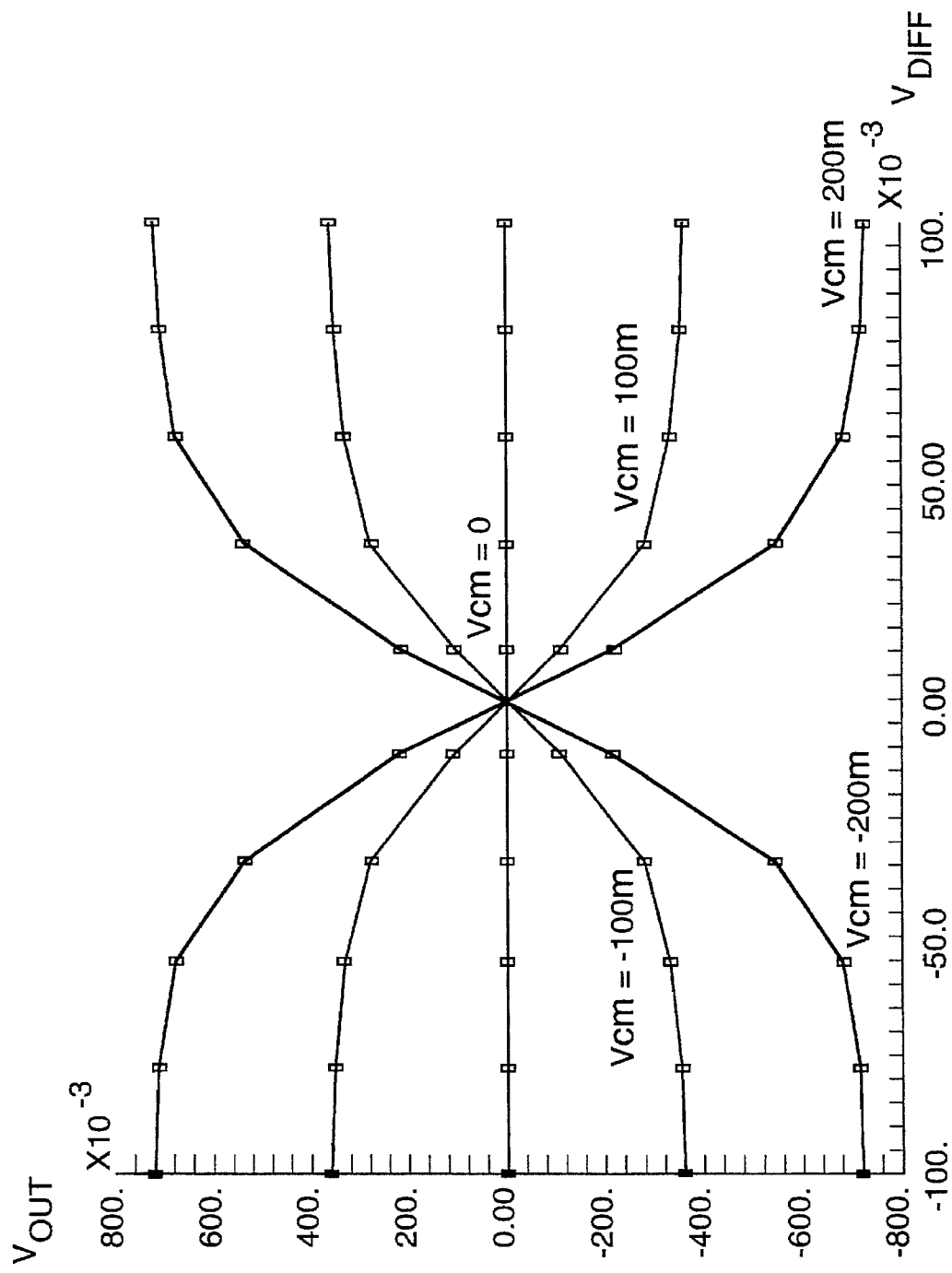
FIG. 7A is an output voltage versus input voltages (differential plus common mode) response plot for the circuit of FIG. 7 with zero-value emitter resistances.
Figure 7B:
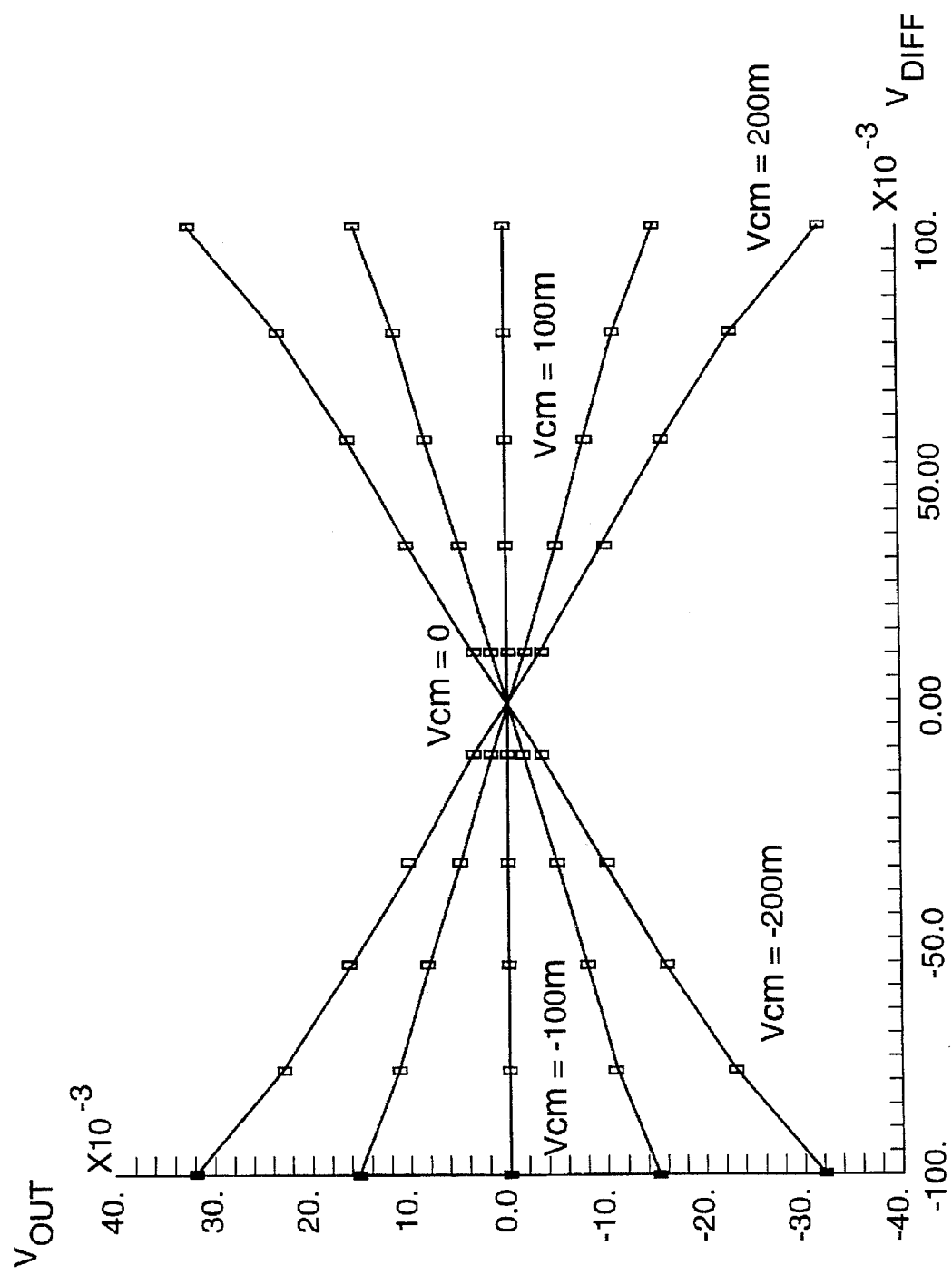
FIG. 7B is an output voltage versus input voltages (differential plus common mode) response plot for the circuit of FIG. 7 with emitter resistances as shown.

Referring to FIGS. 7A and 7B, this further improvement in linearity of the output voltage $V_{OUT}$ can be better appreciated. In FIG. 7A, the output voltage $V_{OUT}$ is plotted for when the emitter resistances R6, R7, R8, R9 are zero (i.e. R6=R7=R8=R9=0 ohms), the input differential signal voltage $V_{DIFF}$ has values between −100 mV and +100 mV and the input common mode voltage $V_{CM}$ has values of −200 mV, −100 mV, 0, +100 mV and +200 mV. In FIG. 7B, the output voltage $V_{OUT}$ is plotted for when the emitter resistances R6, R7, R8, R9 are as shown (i.e. R6=R7=R8=R9= 200 ohms), the input differential signal voltage $V_{DIFF}$ has values between −100 mV and +100 mV and the input common mode voltage $V_{CM}$ has values of −200 mV, −100 mV, 0, +100 mV and +200 mV. As can be seen, with zero emitter resistances, the output voltage $V_{OUT}$ is substantially linear for a range of input differential signal voltage $V_{DIFF}$ values between −30 mV and +30 mV, while with emitter resistances, the output voltage $V_{OUT}$ is substantially linear for a much wider range of input differential signal voltage $V_{DIFF}$ values, e.g. beyond the plotted values of −100 mV and +100 mV.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a common mode controlled signal multiplier, said signal multiplier comprising:

a first differential amplifier for receiving in combination a first common mode signal with a first frequency and a first input signal with a second frequency; and a second differential amplifier, coupled to said first differential amplifier, for receiving in combination a second common mode signal with said first frequency and a second input signal with said second frequency;

wherein said first and second differential amplifiers, in accordance with said combinations of said first and second common mode signals and said first and second input signals, together provide an output signal with third and fourth frequencies which equal a sum of said first and second frequencies and a difference between said first and second frequencies, respectively.

2. The apparatus of claim 1, wherein said first and second common mode signals are opposite in phase from one another.

3. The apparatus of claim 1, wherein said first and second input signals comprise first and second differential input signals, respectively.

4. The apparatus of claim 1, wherein said first and second differential amplifiers comprise a plurality of emitter-coupled bipolar transistors.

5. The apparatus of claim 1, wherein said first and second differential amplifiers are coupled to one another at first and second nodes and said output signal is provided via at least one of said first and second nodes.

6. The apparatus of claim 1, wherein said output signal comprises a differential signal.

7. An apparatus including a common mode controlled signal multiplier, said signal multiplier comprising:

a first transistor which includes an input terminal for receiving in combination a first input signal with a first frequency and a second input signal with a second frequency, a biasing terminal, and an output terminal;

a second transistor which includes an input terminal for receiving in combination said first input signal and a third input signal with said second frequency, a biasing terminal coupled to said first transistor biasing terminal, and an output terminal;

a third transistor which includes an input terminal for receiving in combination a fourth input signal with said first frequency and a fifth input signal with said second frequency, a biasing terminal, and an output terminal coupled to said first transistor output terminal; and a fourth transistor which includes an input terminal for receiving in combination said fourth input signal and a sixth input signal with said second frequency, a biasing terminal coupled to said third transistor biasing terminal, and an output terminal coupled to said second transistor output terminal;

wherein, in accordance with said combinations of said first, second, third, fourth, fifth and sixth input signals, said coupled first and third transistor output terminals provide a first output signal with third and fourth frequencies and said coupled second and fourth transistor output terminals provide a second output signal with said third and fourth frequencies, and wherein said third and fourth frequencies equal a sum of said first and second frequencies and a difference between said first and second frequencies, respectively.

8. The apparatus of claim 7, wherein said first and fourth input signals are opposite in phase from one another, said second and third input signals are opposite in phase from one another and said fifth and sixth input signals are opposite in phase from one another.

9. The apparatus of claim 7, wherein said first and second transistors comprise first and second emitter-coupled bipolar transistors.

10. The apparatus of claim 9, wherein said third and fourth transistors comprise third and fourth emitter-coupled bipolar transistors.

11. A method of multiplying signals with common mode control, said method comprising the steps of:

receiving in combination, with a first differential amplifier, a first common mode signal having a first frequency and a first input signal having a second frequency;

receiving in combination, with a second differential amplifier coupled to said first differential amplifier, a second common mode signal having said first frequency and a second input signal with said second frequency; and generating, with said first and second differential amplifiers in accordance with said combinations of said first and second common mode signals and said first and second input signals, an output signal with third and fourth frequencies which equal a sum of said first and second frequencies and a difference between said first and second frequencies, respectively.

12. The method of claim 11, wherein said first and second common mode signals are opposite in phase from one another.

13. The method of claim 11, wherein said first and second input signals comprise first and second differential input signals, respectively.

14. The method of claim 11, wherein said first and second differential amplifiers comprise a plurality of emitter-coupled bipolar transistors.

15. The method of claim 11, wherein said first and second differential amplifiers are coupled to one another at first and second nodes and said output signal is provided via at least one of said first and second nodes.

16. The method of claim 11, wherein said output signal comprises a differential signal.

17. A method of multiplying signals with common mode control, said method comprising the steps of:

receiving in combination, with an input terminal of a first transistor, a first input signal having a first frequency and a second input signal having a second frequency;

receiving in combination, with an input terminal of a second transistor, said first input signal and a third input signal having said second frequency;

coupling a biasing terminal of said second transistor to a biasing terminal of said first transistor;

receiving in combination, with an input terminal of a third transistor, a fourth input signal having said first frequency and a fifth input signal having said second frequency;

coupling an output terminal of said third transistor to an output terminal of said first transistor;

receiving in combination, with an input terminal of a fourth transistor, said fourth input signal and a sixth input signal having said second frequency;

coupling a biasing terminal of said fourth transistor to a biasing terminal of said third transistor; and coupling an output terminal of said fourth transistor to an output terminal of said second transistor;

wherein, in accordance with said combinations of said first, second, third, fourth, fifth and sixth input signals, said coupled first and third transistor output terminals provide a first output signal with third and fourth frequencies and said coupled second and fourth transistor output terminals provide a second output signal with said third and fourth frequencies, and wherein said third and forth frequencies equal a sum of said first and second frequencies and a difference between said first and second frequencies, respectively.

18. The method of claim 17, wherein said first and fourth input signals are opposite in phase from one another, said second and third input signals are opposite in phase from one another and said fifth and sixth input signals are opposite in phase from one another.

19. The method of claim 17, wherein said first and second transistors comprise first and second emitter-coupled bipolar transistors.

20. The method of claim 19, wherein said third and fourth transistors comprise third and fourth emitter-coupled bipolar transistors.

* * * * *

UNITED STATES PATENT AND TRADEMARK OFFICE
CERTIFICATE OF CORRECTION

PATENT NO. : 5,650,743
DATED : July 22, 1997
INVENTOR(S) : David Edward Bien et al.

It is certified that error appears in the above-indentified patent and that said Letters Patent is hereby corrected as shown below:

In Col. 9, line 2, delete "forth" and replace with --fourth--.

Signed and Sealed this

Sixteenth Day of September, 1997

Attest:

BRUCE LEHMAN

Attesting Officer

Commissioner of Patents and Trademarks